United States Patent
Kelder et al.

(10) Patent No.: US 8,993,051 B2
(45) Date of Patent: Mar. 31, 2015

(54) METHOD FOR COVERING PARTICLES, ESPECIALLY A BATTERY ELECTRODE MATERIAL PARTICLES, AND PARTICLES OBTAINED WITH SUCH METHOD AND A BATTERY COMPRISING SUCH PARTICLE

(75) Inventors: Erik Maria Kelder, Nootdorp (NL); Jan Rudolf Van Ommen, Zwijndrecht (NL); John Nijenhuis, Asperen (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 11/955,184

(22) Filed: Dec. 12, 2007

(65) Prior Publication Data

US 2009/0155590 A1  Jun. 18, 2009

(51) Int. Cl.
| | |
|---|---|
| B05D 7/00 | (2006.01) |
| H01M 4/505 | (2010.01) |
| B01J 2/16 | (2006.01) |
| C23C 16/44 | (2006.01) |
| C23C 16/442 | (2006.01) |
| C23C 16/455 | (2006.01) |
| H01M 4/36 | (2006.01) |

(52) U.S. Cl.
CPC  *H01M 4/505* (2013.01); *B01J 2/16* (2013.01); *C23C 16/4417* (2013.01); *C23C 16/442* (2013.01); *C23C 16/45525* (2013.01); *H01M 4/366* (2013.01); *Y02E 60/122* (2013.01)
USPC .......................................... 427/213; 427/212

(58) Field of Classification Search
None
See application file for complete search history.

(56) References Cited

U.S. PATENT DOCUMENTS

| 6,913,827 | B2* | 7/2005 | George et al. ................. 428/402 |
| 2001/0034123 | A1* | 10/2001 | Jeon et al. ...................... 438/643 |
| 2002/0106461 | A1* | 8/2002 | Talton .............................. 427/596 |
| 2002/0192551 | A1* | 12/2002 | Yoshizawa et al. ........... 429/221 |
| 2004/0087143 | A1* | 5/2004 | Norman et al. ................ 438/680 |
| 2004/0159830 | A1* | 8/2004 | Weimer et al. .................. 257/13 |

OTHER PUBLICATIONS

Beetstra, Improved Li-Ion Battery Performance, The 12th International Conference on Fluidization—New Horizons in Fluidization Engineering, vol. RP4, Article 44, Jul. 2007.*
Wayback Machine (Internet) archive—showing Beetstra, 12th International Conference paper available on internet Jul. 2007.*
Kannan, Electrochemical and Solid-State Letters, 5 (7) A167-A169 (2002).*
Lafont, U., "Nanopowders of Spinel-Type Electrode Materials for Li-ion Batteries", *Solid State Ionics*, 177, 2006, pp. 3023-3029.

* cited by examiner

*Primary Examiner* — Joseph Miller, Jr.
(74) *Attorney, Agent, or Firm* — Sunit Talapatra; Tianran Yan; Foley & Lardner LLP

(57) ABSTRACT

A method for covering particles having a diameter of maximally 60 μm by means of atomic layer deposition, whereby said method comprises the step of fluidizing said particles in a fluidized bed reactor using a first reactant gas comprising a first reactant for substantially completely covering said particles with a monolayer of said first reactant.

16 Claims, 7 Drawing Sheets

Figure 1:
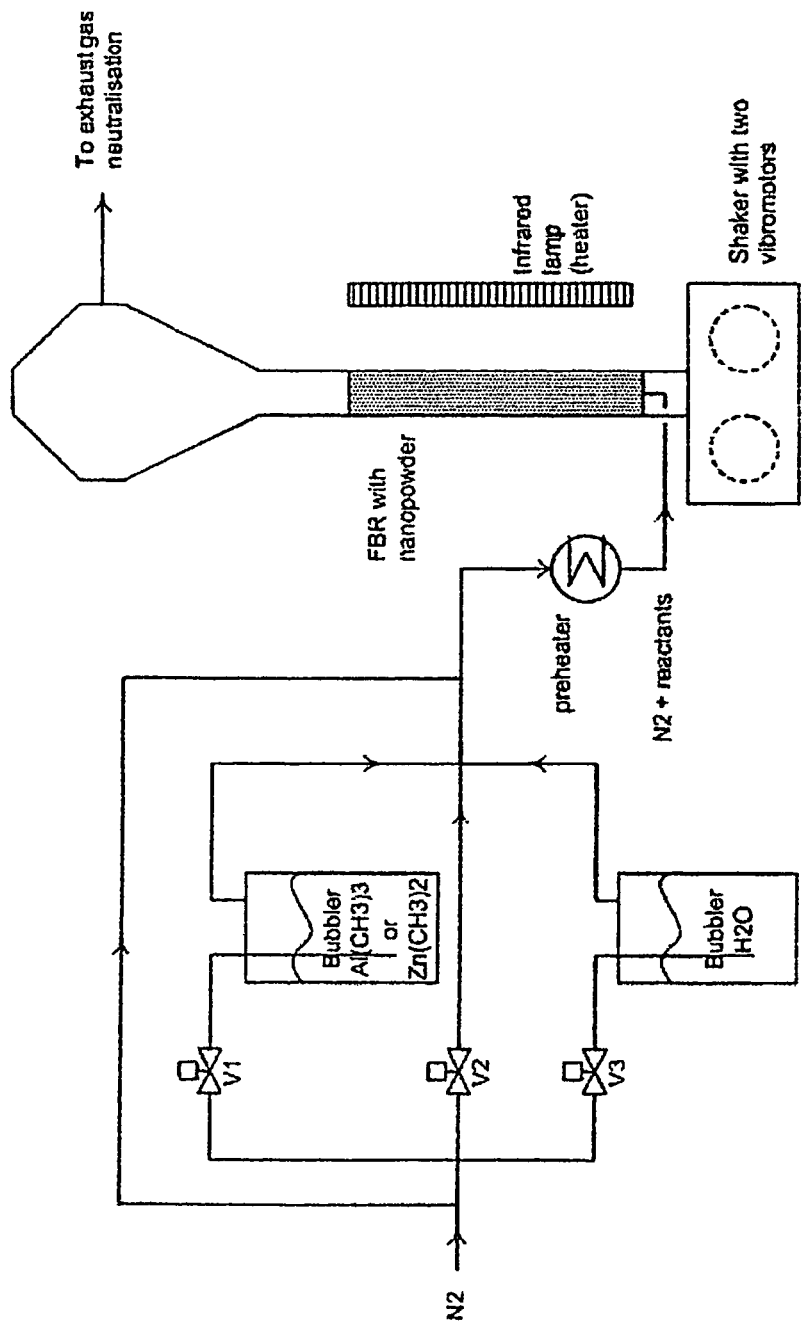

METHOD FOR COVERING PARTICLES, ESPECIALLY A BATTERY ELECTRODE MATERIAL PARTICLES, AND PARTICLES OBTAINED WITH SUCH METHOD AND A BATTERY COMPRISING SUCH PARTICLE

STATEMENT REGSRDING FEDERALLY SPONSORED RESEARCH OR DEVELOPMENT

Not Applicable.

CROSS-REFERENCE TO RELATED APPLICATIONS

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to a method for covering particles having a diameter of maximally 60 μm by means of atomic layer deposition. The present invention also relates to particles obtainable by such method, and a battery containing said particles.

2. Description of Related Art

Such a method is known from the art. Although hereinafter mainly reference will be made to particles to be used in a battery, for example and preferably lithium containing particles, such as $LiMn_2O_4$, $LiCoO_2$ or $LiNiO_2$ as well as other lithium containing materials, such as $LiFePO_4$ and others, the method can be used for subjecting all kinds of particles in the said size range by means of atomic layer deposition.

In the art, the use of lithium ion batteries has many advantages over other cathode material containing batteries, especially with respect to rechargeable batteries. Compared to nickel-cadmium batteries and nickel-metal-hydride batteries, the output voltage of lithium ion batteries is higher. Secondly, the energy density is higher, resulting in smaller and lighter batteries. Other advantages of lithium ion batteries are a low self-discharge, good cycle-life and very low maintenance. Drawbacks of lithium ion materials are the relatively high costs and long charging times, and the fact that the batteries age in time, whether they are being used or not.

During the discharge of the lithium ion batteries, lithium ions are transferred from the negative electrode side of the battery to the positive electrode side. Recent research activities have provided new electrode materials, that provide an improved transport of lithium ions. An example of this material is $Li_4Ti_5O_{12}$, which is used as a negative electrode material having the spinel structure. This material has a three-dimensional structure for lithium intercalation (the insertion of lithium into the crystal lattice). With this material, high charge and discharge rates are possible. A draw-back of this material is that the potential at which lithium intercalation occurs is much higher than that for negative electrode materials used thus far. As a result, the battery will have a lower output voltage than was usual for lithium ion batteries. To compensate for this problem, new positive electrode materials have been developed with higher potentials than the currently used materials. Potential (Possible) new positive electrode materials are based on $LiMn_2O_4$ (comprising a 50/50 combination of $Mn^{3+}$ and $Mn^{4+}$), with possible additives like Mg, Ni, like $LiMg_xNi_{0.5-x}Mn_{1.5}O_4$, (comprising only $Mn^{4+}$) which is also of the spinel-type. The positive electrode voltage is 4.7-4.9 V, against $Li/Li^+$. Therefore, the battery output voltage for a combination consisting of $Li_4Ti_5O_{12}$/$LiMg_xNi_{0.5-x}Mn_{1.5}O_4$ (comprising $Mn^{4+}$, and a combination of $Ni^{2+}$ and $Ni^{4+}$) can be 3.2-3.4 V, which still is a very acceptable value.

Hereafter in this description the negative electrode will be referred to (identified) as the anode and the positive electrode will be referred to (identified) as the cathode.

A problem with the above identified cathode material is the dissolution of transition metal ions, especially Mn-ions, in the electrolyte. When this occurs, the structure of the material changes and there is a smaller number of positions available for lithium intercalation. In addition, the high oxidation ability of $Mn^{4+}$-ions may lead to a decomposition of the solvents in the electrolyte. These factors lead to a capacity loss that is independent of the cycling but proceeds progressively in time. The capacity fading increases with temperature: when Li-ion batteries are stored at temperatures of 60° C., a battery may lose up to 40% of its capacity in only three months time. The problem is more severe for high-voltage materials (e.g. Mn and Fe comprising materials) than for "regular" cathode materials. A specific example of a Fe-containing cathode material, is $LiFe_xTiyMn_{2-x-y}O_4$ wherein $0<y<0.3$.

Recently, also research has been performed dedicated to the use of nano-powders in batteries. These powders have several advantages over the current cathode or anode materials. Firstly, the surface area per weight increases strongly, leading to enhanced charge transfer (faster charging). Secondly, the diffusion lengths for Li-ions are very short, which enhances the power performance by increasing the effective capacity for lithium storage. Thirdly, the nano-powders are much more resistant to stresses due to expansion and shrinking during intercalation and de-intercalation of the lithium ions, which cause crystal fatigue and loss of capacity in regular cathode materials.

An important drawback of nano-materials in batteries is the increased dissolution of the transition metal ions. This dissolution in the electrolyte is a surface related problem, and therefore increases very fast with decreasing particle size.

BRIEF SUMMARY OF THE INVENTION

Therefore, the invention aims at providing a method for protecting the nano-particles from dissolution in the electrolyte.

The invention also aims at providing a method for providing a coating on nano-particles, without influencing the electrochemical properties of the particles.

The invention especially aims at providing a coating on lithium containing particles of less than 60 μm.

DETAILED DESCRIPTION OF THE INVENTION

According to the invention, the method for covering said particles comprises the steps as mentioned in claim 1. By means of this method, a very uniform and as thin as possible layer is obtained on said nano-particles. According to a preferred embodiment, the method further comprises the step of (b) subsequently fluidizing said particles in said fluidized bed reactor using a second reactant gas comprising a second reactant for substantially completely covering said particles obtained in step (a) with a monolayer of said second reactant. Such a method is especially preferred if a layer should be provided on the nano-particles that is a product of two different reactants, that are provided subsequently to the nano-particles. Such is especially very suitable if the first reactant adsorbs on and/or optionally reacts with the nano-particles, and wherein the second reactant adsorbs on and/or reacts with the first layer that is provided on the nano-particles. A preferred embodiment comprises the step adding as said first reactant a component chosen from any of: a hydroxide providing component, an oxide providing reactant, an alkyl metal providing component, a metal alkanolate providing component, or the like, and adding as said second reactant a reactant that is different from said first reactant and is chosen from any of: a hydroxide providing component, an oxide providing reactant, an alkyl metal providing component, a metal alkanolate providing component, or the like. As a matter of fact, if the nano-particles already comprise an oxide layer or a hydroxide layer, the first step of the method according to the invention may comprise adding a reactant that provides a metal on said nano-particles, preferably an alkyl metal compound or a metal alkanolate compound, such that a monolayer of the reaction product of this metal with the hydroxide or oxide may be obtained. If required, a further suitable reactant may subsequently be added, so as to obtain a dry alumina monolayer on said material (or any respective metal oxide layer, for example a zincoxide monolayer).

Any combination of reactants may be added subsequently during fluidization of the nano-particles, so as to add a first reactant that adsorbs to and/or reacts with the surface layer of the nano-particles, wherein the second reactant adsorbs to and/or reacts with the firstly added reactant, and one or more further reactants are added in subsequent steps for further adsorption to and/or reaction with said secondly added reactant.

All steps wherein different reactants are added, are performed subsequently. The addition of the first reactant in a carrier gas or as a pure reactant, may be followed by the addition of a second reactant, optionally in a carrier gas or as a pure reactant, and may be performed without interruption, and optionally with the intermittent addition of a gas that is non-reactive (i.e., inert) to the nano-particles and/or the reactant added previously.

A suitable method may consist of adding a fluidization gas to the particles in a fluidized bed and injecting, or otherwise adding, said reactant to the fluidization gas. This is a convenient way to keep the fluidization gas substantially constant and wherein the amount of reactant can be adjusted precisely.

It is preferred that the method is performed on partides having a diameter of maximally 60 μm. Preferably, the particles have a diameter in the range within 10 nm and 500 nm. More preferably, the diameter of the particles is at least 10 nm at maximally 100 nm.

It has shown that a battery containing electrode particles that are protected by means of a nano-layer that is obtained by a method according to the present invention, has an increased lifetime. Although a fluidization technique has already been used for atomic layer deposition on small particles, this method has hitherto not been used for nano-particles. Fluidization techniques for such particles are only known for systems where the pressure in the fluidization reactor is reduced. According to the present invention, it has shown that it is possible to use increased pressures in the fluidization reactor, of about atmospheric pressure or above. As a rule, this pressure is measured at a position above the fluidized bed.

It was regarded impossible to perform an atomic layer deposition technique on nano-particles since, due to the very high contact surface the heat production would become too high. However, with the present invention this has shown to be no problem at all. On the contrary, the temperature in the fluidized bed is very homogeneous, probably due to the intense mixing of the particles in the fluidized bed. As a consequence, the covering of the nano-particles with the reactant (reactants) is very homogeneous, such that nano-particles are obtained with a very homogeneous nano-layer thereon, and as a result of which, the batteries have a very constant quality.

The method according to the state of the art for covering nano-particles consisted of using a chemical vapor deposition technique on nano-particles, however, without intense stirring of the nano-particles. As a consequence, the layer covering the nano-particles was very inhomogeneous and hence, the quality of the batteries obtained therewith also fluctuated greatly.

According to the state of the art, the dimensions of the nano-particles were increased, with a consequence that diffusion length of the lithium ions increases, and the charging and discharging time also increased.

The Invention

The invention will now be further elucidated by means of an example. This example is only intended to provide an explanation of the invention, and should not be regarded as a limitation to the scope of protection.

In the fluidized bed reactor, a vibrator is used. Due to this vibrator, an increased fluidization of the nano-particles is obtained. However, this vibrator is not an obligation.

BRIEF DESCRIPTION OF THE SEVERAL
VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 1 shows a schematic drawing of the experimental setup for the ALD-process (atomic layer deposition). It consists of a 26 mm internal diameter, 500 mm long glass reactor tube that is filled with $LiMg_{0.05}Ni_{0.45}Mn_{1.5}O_4$ nano-particles with a diameter of 10-50 nm. The reactor is placed on a shaker driven by two vibromotors that produce a low amplitude vibration at adjustable frequency to assist fluidization. The fluidizing gas is nitrogen. Each ALD-cycle consists of four process steps:

1. Valve V1 is opened, so that part of the nitrogen is led through a bubbler containing the organo-metallic precursor and saturated with its vapor. This vapor adsorbs on the particle surface;
2. When the complete particle surface is covered with the precursor, V1 is closed and V2 is opened to flush the tubes with pure nitrogen. This prevents (undesired) reactions in the tubes;
3. V2 is closed and V3 opened to lead the gas through a bubbler containing water. The water vapor reacts with the organo-metal on the surface of the powder;
4. V2 is opened again and V3 closed to clear the tubes for the next cycle.

These steps are repeated until a sufficient number of cycles have been performed to achieve the desired thickness of the coating.

The variables that can be adapted in the ALD-process are the number of cycles, coating material, overall flow, reactant concentration, cycle times for precursor and water, vibration frequency, reaction temperature, etc. During the process the temperature, pressure difference and pressure fluctuations are recorded.

For the experiments described in this paper, only the fluidization part of the set-up has been used, i.e., gas without reactants for the fluidization, assisted by vibration. The gas flow was varied from 0 to 2/min. (velocities of 0-63 mm/s), and several vibration frequencies were used, ranging from 0-47 Hz. Higher gas velocities were not used because the particles started to be elutriated from the column.

Pressure fluctuations were measured at a frequency 20 of 400 Hz using piezo-electric pressure transducers, Kistler type 7261, at two heights in the column: 50 mm and 125 mm above the gas distributor. For titania particles, that were used in some experiments, the data from 125 mm are given here because of a blockage of the lower measuring point after some time; for the cathode particles the height of 50 mm was used due to the lower initial bed height. For the titania particles, the data from the higher and lower measuring point were comparable. The fluidization experiments were done at room temperature and atmospheric pressure.

Figure 2:
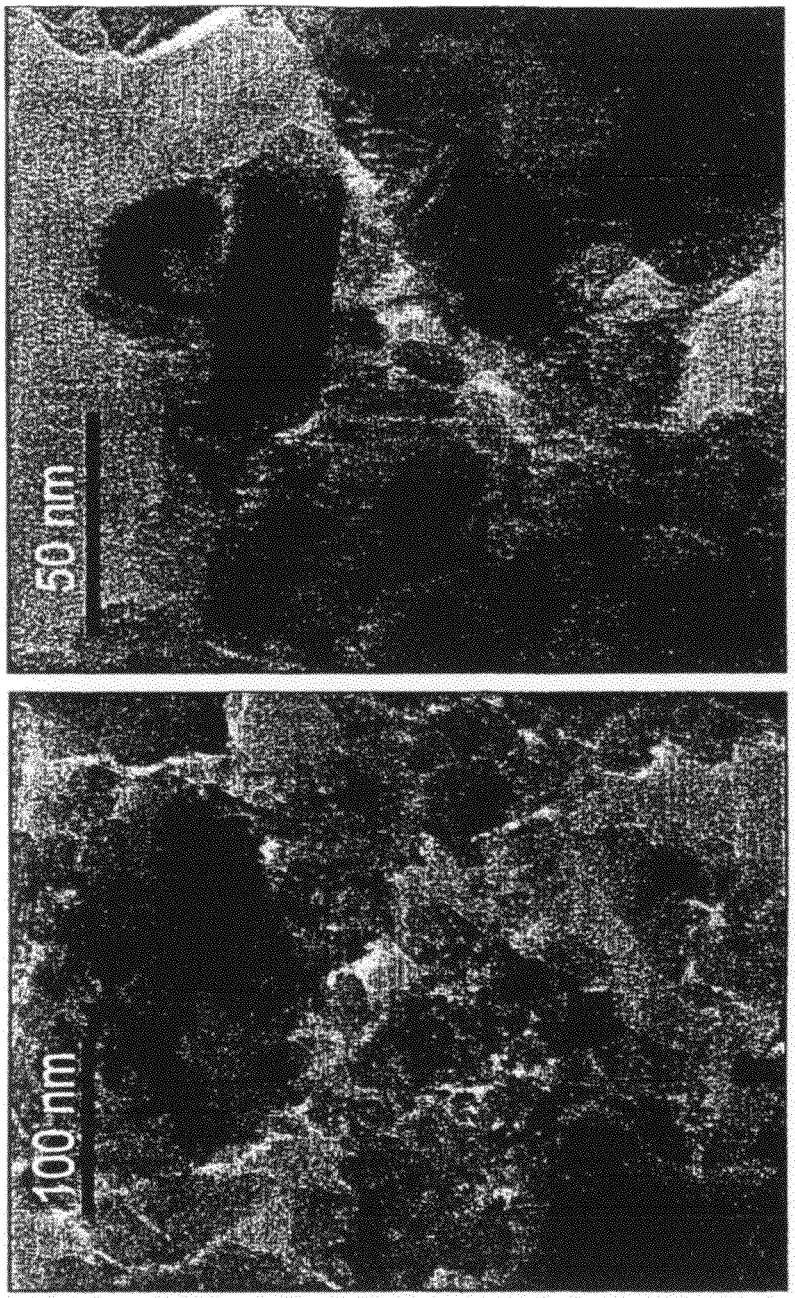

Two types of particles were used: the first type is the $LiMg_{0.05}Ni_{0.45}Mn_{1.5}O_4$ cathode material, which was prepared by an auto-ignition method (described by Lafont et al.). FIG. 2 shows TEM (transmission electron microscope) pictures of this material. The particle dimensions observed in these TEM images are 20-100 nm. A (Brunauer-Emmett-Teller) BET-analysis rendered a surface of 6.4 $m^2/g$, from which an equivalent diameter of 213 nm can be calculated. Laser diffraction showed a very wide particle size distribution, ranging from 40 nm or smaller (40 nm is the lower limit of the apparatus) to 60 μm (clusters). Combination of these measurements leads to the conclusion that the particles form clusters, and that part of the clusters are "hard" aggregates, with some necking between the primary particles. To make a comparison possible, also a more common type of nanoparticles has been investigated: commercial titania particles. These particles have a diameter of 20-25 nm and a surface area of 90 $m^2/g$ (data from manufacturer Kerr-McGee Pigments). It is expected that it is a loose powder and at all aggregates in this powder are soft aggregates that break up easily.

Figure 3:
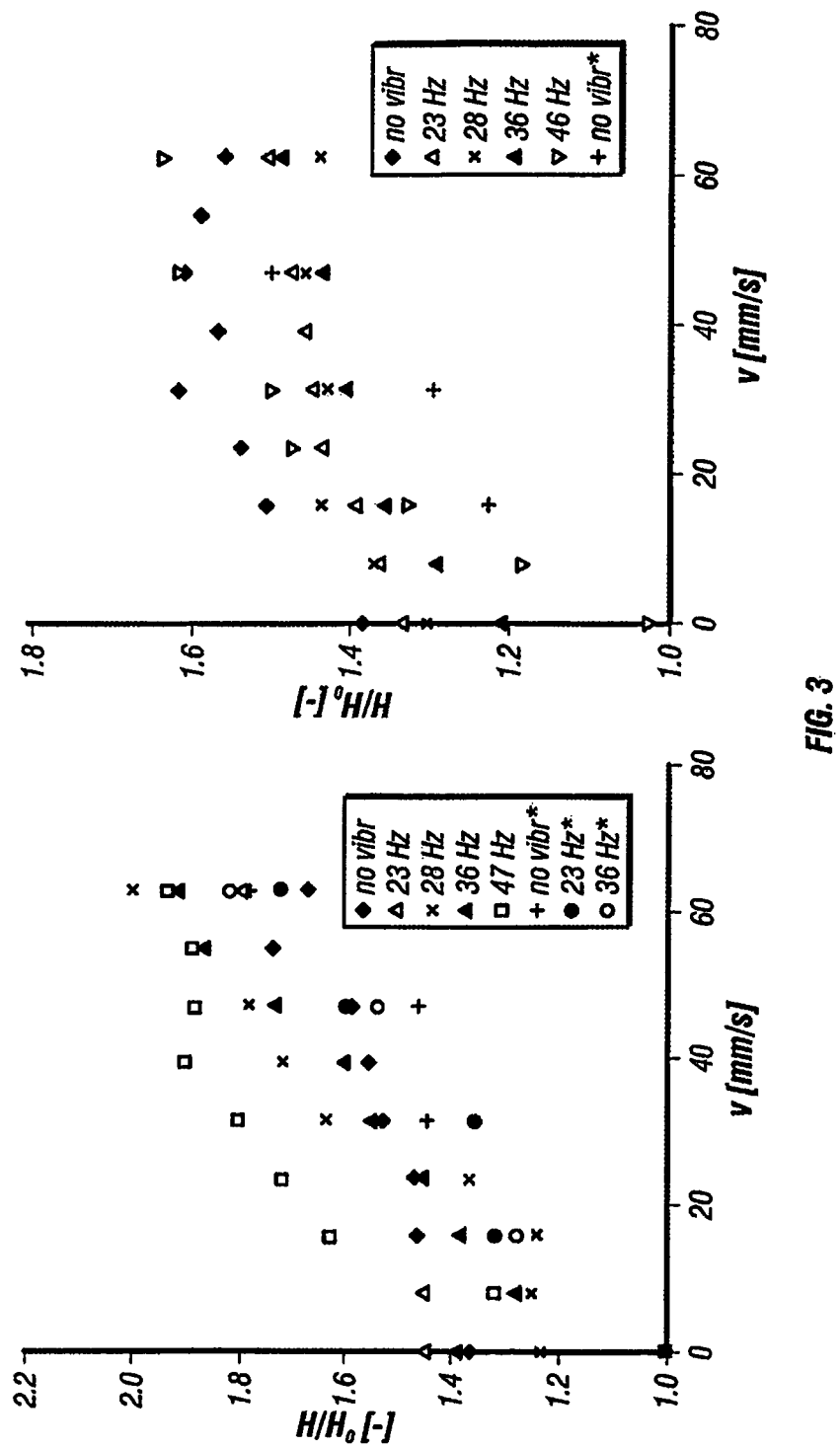

FIG. 3 shows the relative bed expansion during the experiments. To calculate this, the minimum bed height as measured during all experiments, was taken as the initial bed height $H_0$. This minimum was found when the bed was compacted at the highest vibration frequency. For these experiments, the vibration frequency was set to a fixed value, and the gas velocity adjusted. We started with the lowest frequency.

However, the experiments were also carried out with particles with a history of vibration, also at high frequencies; these particles are marked with an * in the figures. The graphs confirm that the initial bed height depends on the vibration frequency, at higher frequencies the particles are packed closer.

Visual observations of the fluidization behavior of the cathode particles suggest that at low gas velocities, there is some channeling. At higher velocities, the eruptions at the bed surface are more violent and appear to originate from (small) bubbles, although these are hard to distinguish since the powder is black. The vibrations have some influence: at high frequencies bubbles start to appear at lower gas velocities. The effect was not quantified due to aforementioned visibility problems. For the (white) titania powder it is easier to distinguish channels and bubbles. For each velocity and frequency, there is a certain part in the bottom of the bed that is not moving. Some large aggregates can be distinguished here and channeling occurs in between these aggregates. The height of this part decreases with gas velocity and vibration frequency. Above this bottom zone, the bed fluidizes with small bubbles. A memory effect could be noticed for both particle types, although it was stronger and lasted longer for the titania. The non-moving bottom zone was much smaller for particles with a history of vibration than for "fresh" particles. An explanation could be that part of the aggregates was broken up by the high frequencies, and only the very large (hard) aggregates remained. The bed expansion factor $H/H_0$ reached a maximum value of 2.0 for the cathode particles and 1.63 for the titania particles. It was also found that when the vibration and gas flow are stopped, the bed does not return to its initial height, and even after several days it may still be expanded ($H/H_{0\_}1$, 4), showing that the aggregates are very loosely packed. The measured porosities for the cathode particles were in the range of 0.66-0.83, and for the titania it was 0.87-0.92.

Figure 4A:
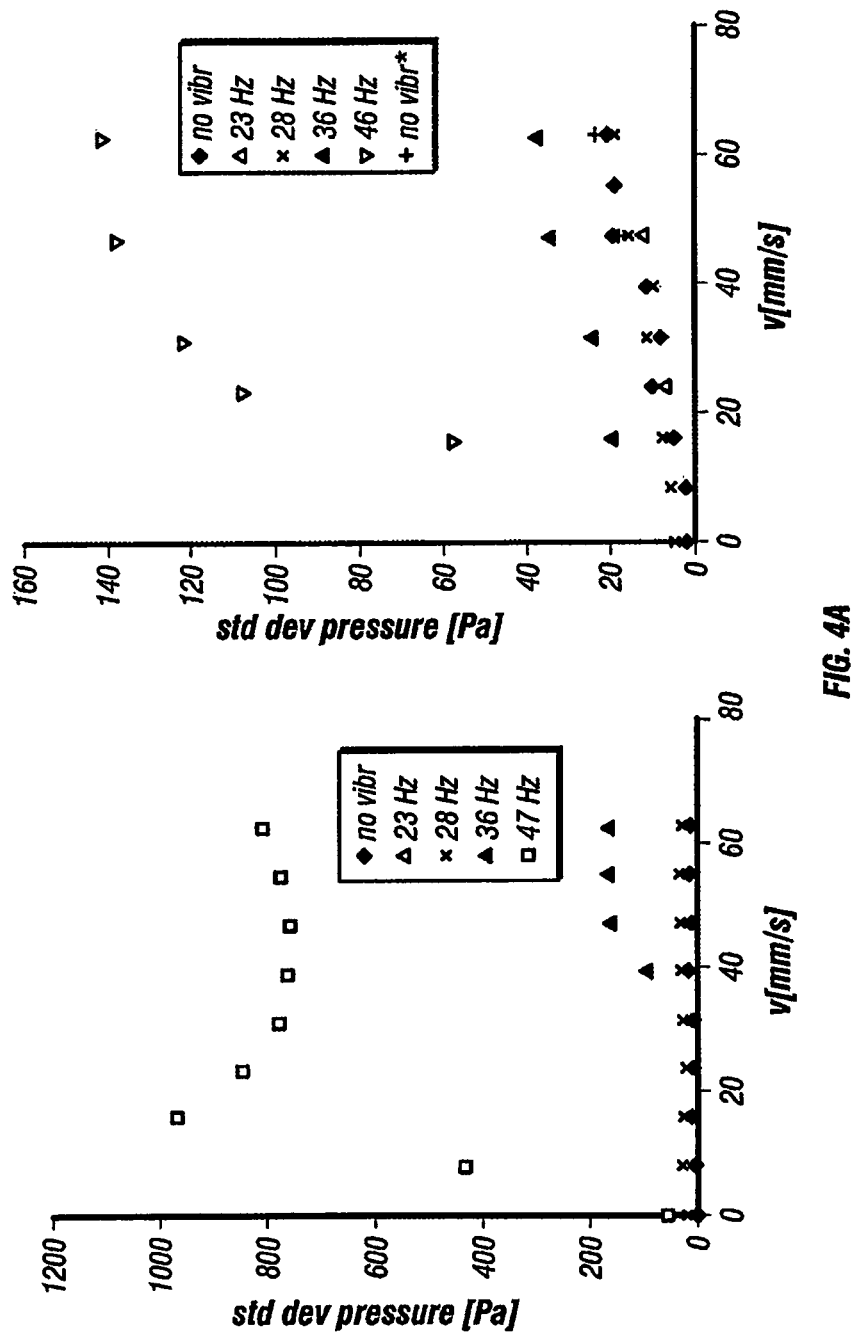
Figure 4B:
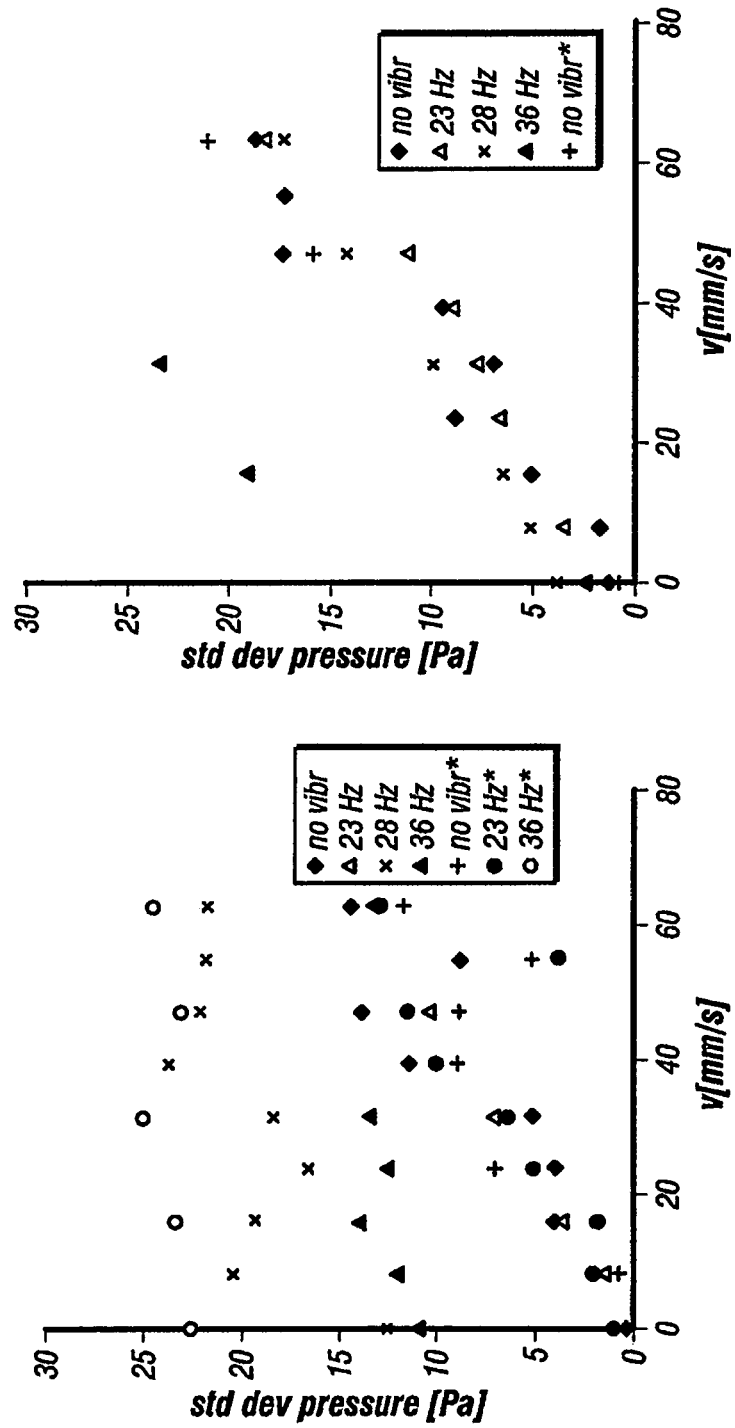

FIGS. 4a and 4b show the standard deviation of the pressure signal during the experiments, which could provide information on the regime in which the fluidized bed is operating. The pressure fluctuations in the experiments with a high vibration frequency are determined mainly by the vibrations, the influence of the gas flow was minor. This was confirmed by the power spectrum, where high peaks occurred at the vibration frequency. When there is no vibration or vibration at a low frequency, there is a noticeable influence of the gas flow on the pressure fluctuations, as is observed in a regular gas-fluidized bed as well.

For the cathode particles, the sudden rise followed by a decrease in the fluctuations at high frequencies could indicate a transition from bubbling to turbulent regime. However, more data are necessary to confirm this and explain the mechanism. For the $TiO_2$ this transition was not observed for the studied range of gas velocities. The data series from particles with a vibration history show that this history and the change in fluidization behavior it causes do not have a large influence on the pressure fluctuations.

Figure 5:
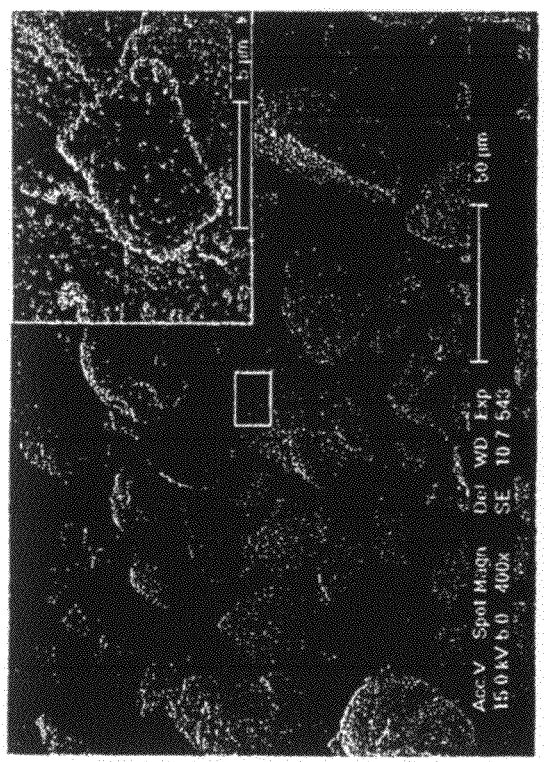

FIG. 5 further shows SEM (scanning electron microscope) photographs of particles obtained according to the method of the present invention and wherein as a first reactant water was added for forming a hydroxide monolayer on the particles ($LiMn_2O_4$). Then, trimethylaluminium (TMA) was added to the fluidization gas so as to perform a reaction of said TMA with the hydroxide monolayer. Subsequently, a further addition of water was performed, and a first monolayer of alumina on said particles was obtained. This combination of steps was repeated until an alumina layer on said particles was obtained in a sufficient thickness and was very homogeneous. The layer turned out to have a thickness of about 2 nm and consisted (by means of EDX (energy dispersive x-ray) in a SEM) of aluminium oxide.

Figure 6:
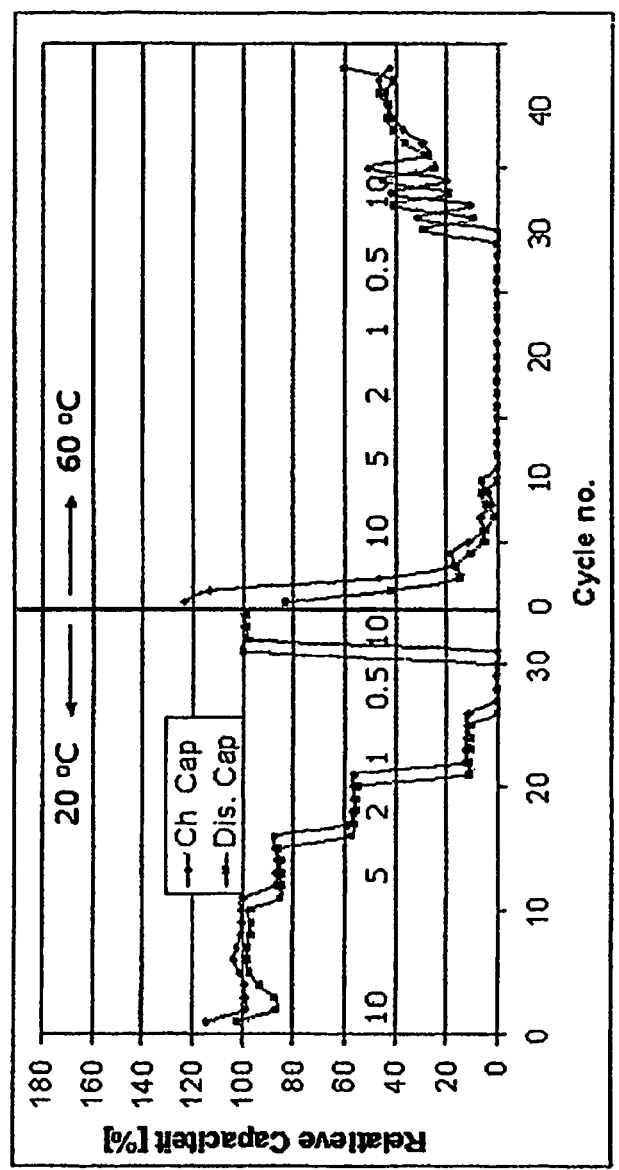

The FIG. 6 shows the results on cyclic behavior of repeatedly charging and discharging batteries made from the coated particles according to the invention and uncoated particles as a reference example. Both at low temperature (20° C.) and high temperature (60° C.) the capacity at fast and slow discharge and charge rate is much higher in the batteries containing the coated particles as cathode material. Also, the uncoated particles show a clear fading in capacity due to degradation of the cathode material.

Therefore, from the above example, it can be concluded that the method, according to the present invention, is a suitable way for providing a protective layer on nano-particles.

What is claimed is:

1. A method of providing coated particles as an electrode material for a lithium ion battery, wherein the particles have a diameter of maximally 60 µm, comprise battery electrode material and lithium, and have a covering obtained by an atomic layer deposition method, comprising:
    (a) fluidizing said particles comprising the battery electrode material having lithium ions in a fluidized bed reactor using a first reactant gas comprising a first reactant for substantially covering said particles with a monolayer of said first reactant;
    (b) subsequently fluidizing said particles obtained in step (a) in said fluidized bed reactor using a second reactant gas comprising a second reactant for substantially covering the monolayer on said particles obtained in step (a); and
    (c) repeating step (a) and step (b) sequentially to obtain the coated particles having a coating thickness of about 2 nm or less.

2. A method according to claim 1, wherein:
said first reactant is chosen from any of:
    a hydroxide providing component,
    an oxide providing reactant,
    an alkyl metal providing component, and
    a metal alkanolate providing component, and
said second reactant is different from said first reactant and is chosen from any of:
    a hydroxide providing component,
    an oxide providing reactant,
    an alkyl metal pro-viding component, and
    a metal alkanolate providing component.

3. A method according to claim 1, wherein said second reactant adsorbs to and/or reacts with said first reactant.

4. A method according to claim 1, wherein step (a) and step (b) are at least partially performed repeatedly.

5. A method according to claim 1, wherein step (b) is performed such that the fluidization between step (a) and step (b) is uninterrupted.

6. A method according to claim 1, wherein the method comprises the steps of:
    adding a first reactant that comprises a hydroxide or oxide providing reactant for providing a hydroxide monolayer or oxide monolayer on said material;
    subsequently adding a second reactant that comprises an alkyl metal or metal alkanolate, and reacting said alkyl metal or metal alkanolate with said hydroxide monolayer or oxide monolayer so as to provide a metal alkyl or metal alkanolate monolayer on said material;
    adding a further reactant comprising water for removing said alkyl or alkanolate groups from and adding OH groups onto said monolayer, and finally removing $H_2O$, so as to obtain a dry metal oxide monolayer on said material.

7. A method according to claim 1, wherein the diameter of said particles is within the range of 10 nm to 60 µm.

8. A method according to claim 6, wherein said alkyl metal compound is comprised of tri-methyl-aluminum, wherein said alkyl groups are methyl groups and wherein said metal oxide monolayer is an alumina monolayer.

9. A method according to claim 4, wherein step (a) and step (b) are at least partially performed repeatedly with different reactants in any of said at least one repeatedly performed step.

10. A method according to claim 7, wherein the diameter of said particles is within the range of 10 nm to 500 nm.

11. A method according to claim 10, wherein the diameter of said particles is within the range of 10 nm to 100 nm.

12. The method according to claim 1, wherein the particles as an electrode material are configured as cathode material.

13. The method according to claim 1, wherein the coated particles have a coating thickness of about 2 nm.

14. A method of providing coated particles as an electrode material for a lithium ion battery, wherein the particles have a diameter of maximally 60 µm, wherein the particles are comprised of battery electrode material, wherein the particles are lithium containing particles, and wherein the particles have a covering obtained by an atomic layer deposition method, said atomic layer deposition method comprising the steps of
    (a) at least partially fluidizing said particles comprising the battery electrode material having lithium ions in a fluidized bed reactor using a first reactant gas comprising a first reactant for substantially covering said particles with a monolayer of said first reactant, wherein the pressure in the fluidized bed reactor is between 0.5 and 2 bar;
    (b) subsequently at least partially fluidizing said particles obtained in step (a) in said fluidized bed reactor using a second reactant gas comprising a second reactant for substantially covering the monolayer on said particles obtained in step (a); and
    (c) repeating step (a) and step (b) sequentially to obtain the coated particles having a coating thickness of about 2 nm or less.

15. The method according to claim 14, wherein the pressure in the fluidized bed reactor is between 0.9 and 1.5 bar.

16. The method according to claim 14, wherein the pressure in the fluidized bed reactor is about atmospheric pressure.

* * * * *